United States Patent
Yoshikawa

(10) Patent No.: US 10,589,981 B2
(45) Date of Patent: Mar. 17, 2020

(54) SEMICONDUCTOR PRESSURE SENSOR

(71) Applicant: Mitsubishi Electric Corporation, Tokyo (JP)

(72) Inventor: Eiji Yoshikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/973,672

(22) Filed: May 8, 2018

(65) Prior Publication Data

US 2019/0177154 A1   Jun. 13, 2019

(30) Foreign Application Priority Data

Dec. 13, 2017   (JP) .................... 2017-238289

(51) Int. Cl.
*B81B 3/00* (2006.01)
*G01L 9/00* (2006.01)
*H01L 41/113* (2006.01)

(52) U.S. Cl.
CPC .......... *B81B 3/0021* (2013.01); *G01L 9/0045* (2013.01); *G01L 9/0052* (2013.01);
(Continued)

(58) Field of Classification Search
CPC .......... B81B 3/0021; B81B 2201/0264; H01L 41/1132; G01L 9/0052
See application file for complete search history.

(56) References Cited

U.S. PATENT DOCUMENTS 5,629,538 A * 5/1997 Lipphardt .............. G01L 9/0042
  257/254
6,278,167 B1 * 8/2001 Bever ................... G01L 9/0042
  257/254
(Continued)

FOREIGN PATENT DOCUMENTS

| JP | 2007127440 A | 5/2007 |
|---|---|---|
| JP | 3994531 B2 | 10/2007 |
| JP | 2014170007 A | 9/2014 |

OTHER PUBLICATIONS

Sabrina Bedard et al., "Diffusion of hydrogen in crystalline silicon", Physical Review B, The American Physical Society, 2000, pp. 9895-9898, vol. 61, No. 15, Canada.
(Continued)

*Primary Examiner* — Kyoung Lee
*Assistant Examiner* — Christina A Sylvia
(74) *Attorney, Agent, or Firm* — Sughrue Mion, PLLC; Richard C. Turner

(57) ABSTRACT

Provided is a semiconductor pressure sensor that can maintain high reliability and measure pressure with high accuracy without increasing the size thereof and that has hydrogen permeation prevention performance.
The semiconductor pressure sensor includes: a first semiconductor substrate having a recess formed thereon; a second semiconductor substrate joined to the first semiconductor substrate with an oxide film interposed therebetween; a reference pressure chamber formed as a space surrounded by the recess of the first semiconductor substrate and the second semiconductor substrate; a piezoresistor formed on a surface of the second semiconductor substrate that receives pressure, along an outer periphery of the reference pressure chamber; and a protective film formed on the surface of the (Continued)

second semiconductor substrate that receives pressure, and side surfaces of the second semiconductor substrate and the oxide film.

5 Claims, 10 Drawing Sheets

(52) U.S. Cl.
CPC ........ *G01L 9/0054* (2013.01); *H01L 41/1132* (2013.01); *B81B 2201/0264* (2013.01)

(56) References Cited

U.S. PATENT DOCUMENTS

| | | | |
|---|---|---|---|
| 7,775,119 B1* | 8/2010 | Suminto | G01L 9/0042 73/727 |
| 2001/0019374 A1* | 9/2001 | Izumi | G02F 1/136286 349/43 |
| 2011/0214505 A1* | 9/2011 | Aoki | G01L 9/0054 73/727 |
| 2016/0002026 A1* | 1/2016 | Chodavarapu | B81C 1/00182 257/254 |

OTHER PUBLICATIONS

Communication dated Jul. 10, 2018, from Japanese Patent Office in counterpart application No. 2017-238289.

* cited by examiner

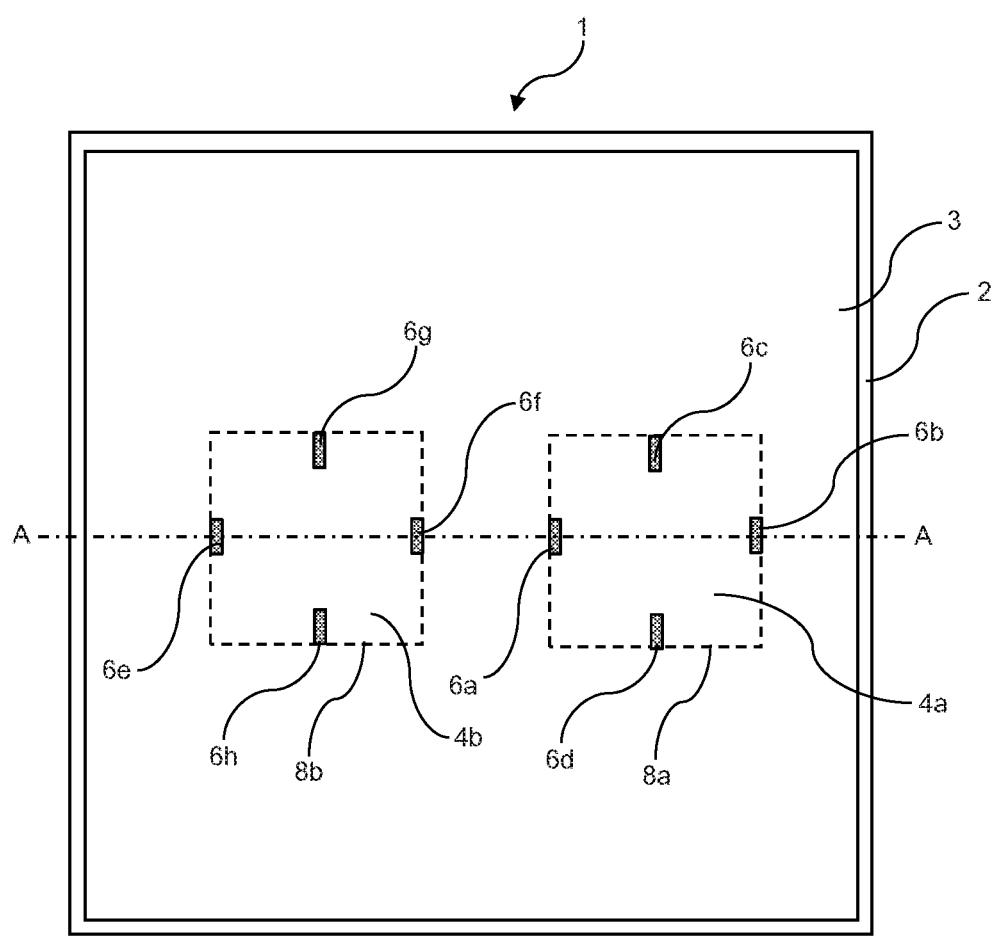

SEMICONDUCTOR PRESSURE SENSOR

BACKGROUND OF THE INVENTION

1. Field of the Invention

The present invention relates to a semiconductor pressure sensor to be used for measuring the pressure of hydrogen gas or gas containing hydrogen gas particularly in an automobile equipped with a fuel cell.

2. Description of the Background Art

In a type of fuel cell system mounted on a fuel cell vehicle or the like, a fuel cell stack capable of generating a high voltage is used. The fuel cell stack is configured such that an insulating plate, a current collecting plate, an end plate, or the like is interposed in a fuel cell stacked body. The fuel cell stacked body is obtained by stacking multiple fuel cell sets. One fuel cell set generally includes: a membrane electrode assembly (MBA) composed of an anode-side electrode, an electrolyte membrane, and a cathode-side electrode; and a separator.

In the fuel cell stack, cell reaction occurs by supplying fuel gas (for example, hydrogen gas) to the anode side and oxygen gas (for example, air) to the cathode side, so that electromotive force is generated, and water is produced at the cathode side. To efficiently perform the power generation, it is necessary to accurately measure the amounts of hydrogen gas and air supplied to the fuel cell stack, and supply hydrogen gas and air while the amounts of hydrogen gas and air are being controlled such that an excess or deficiency thereof is not caused. A pressure sensor is used for controlling hydrogen gas.

Hitherto, a pressure sensor in which a metallic material typified by SUS316 is used for a pressure-receiving housing or a pressure-receiving diaphragm has been used for measuring the pressure of hydrogen gas or gas containing hydrogen gas. The metallic material basically has a problem of hydrogen embrittlement, and thus the surface thereof is subjected to coating for preventing hydrogen embrittlement. Reliability is ensured, but there is a critical problem that the weight is large and the cost is high, so that the pressure sensor is not suitable for vehicle mounting. Furthermore, since the pressure-receiving diaphragm is formed from the metallic material, there is a problem that it is difficult to increase the measurement accuracy and responsiveness.

Meanwhile, a semiconductor pressure sensor in which single crystal silicon is used for a pressure-receiving diaphragm has been used. In the semiconductor pressure sensor, to measure an absolute pressure, the interior of a reference pressure chamber is made into a vacuum state. The reference pressure chamber is often formed by anodic bonding of: a silicon wafer having a pressure-receiving diaphragm; and a glass wafer that is to be a seating. However, regarding the molecular size of hydrogen gas, the covalent radius thereof is about 37 μm, and the van der Haals radius thereof is about 120 μm, that is, the molecular size is very small. Thus, since a porous material such as glass has a property in that gas molecules pass therethrough, there is a problem that such a porous material is not suitable for use for measuring the pressure of gas containing hydrogen.

To handle such problems, there is a semiconductor pressure sensor in which a reference pressure chamber is formed by using a single crystal silicon material without using a glass wafer (for example, see Patent Document 1). In the semiconductor pressure sensor, a first silicon substrate that is to be a seating and a second silicon substrate having a pressure-receiving diaphragm and a recess are joined together in a vacuum state with an oxide film interposed therebetween, and a reference pressure chamber is formed by the recess and the surface of the seating. Piezoresistors are provided at a peripheral portion of the diaphragm. The pressure is measured by the piezoresistors detecting stress generated by the diaphragm bending when pressure is applied. Since the reference pressure chamber is formed by using single crystal silicon as described above, the pressure of gas containing gas having a small molecular size such as hydrogen is also accurately measured. In addition, the operating temperature range of a semiconductor pressure sensor in use for measuring the pressure of air sucked by a fuel cell system mounted on a fuel cell vehicle or the like as intended in the present invention or by an engine mounted on an automobile, is up to about 120° C., and the hydrogen diffusion coefficient of single crystal silicon in such a temperature range is very low. Thus, even in consideration of the hydrogen diffusion coefficient, it is possible to maintain a high vacuum state of the reference pressure chamber (for example, see Non-Patent Document 1 for the temperature dependency of the hydrogen diffusion coefficient).

Patent Document 1: Japanese Patent No. 3994531

Non-Patent Document 1: Sabrina Bedard et al. "Diffusion of hydrogen in crystalline silicon", Phys. Rev. B 61, 9895 (2000)

However, also in the semiconductor pressure sensor in which the reference pressure chamber is formed by using a single crystal silicon material, there are still problems in terms of prevention of a hydrogen permeation phenomenon.

For example, in the semiconductor pressure sensor disclosed in Patent Document 1, a joint interface generated by joining the first silicon substrate and the second silicon substrate is exposed on the side surface of the semiconductor pressure sensor. A plurality of semiconductor pressure sensors are manufactured on a wafer that is a single crystal silicon substrate, and are separated from each other by dicing. Thus, in ordinary manufacture, this exposure cannot be avoided. The joint interface is generated when joint surfaces of two wafers are polished into a mirror surface state and the two wafers are joined together with an oxide film interposed therebetween. When the joint surfaces have flaws such as slight surface roughness, waviness, and scars before being joined, these flaws prevent the two wafers from being closely joined together. If the flaws are left on the joint interface even after the joining, the reference pressure chamber within the semiconductor pressure sensor communicates with an outside hydrogen gas atmosphere via the flaws. The flaws that enable the communication may form leak paths through which hydrogen gas having a small molecular size enters the reference pressure chamber. The first problem is that leak paths generated during manufacture are not blocked. When hydrogen gas enters the reference pressure chamber that should be maintained in a vacuum state in order to measure an absolute pressure, and thus the degree of vacuum of the reference pressure chamber decreases, it becomes impossible to measure pressure with high accuracy, resulting in a decrease in reliability of measurement.

The oxide film required on the joint interface in order to promote joining the two wafers is also exposed on the side surface of the semiconductor pressure sensor the location where the oxide film is exposed, reduction reaction is promoted by hydrogen gas, so that composition variation can occur. Due to the composition variation, a problem also arises in that a residual stress state at the joint interface varies, so that a new leak path occurs and hydrogen gas enters, leading to output variation. The second problem is that a new leak path occurs during measurement of the pressure of hydrogen gas. When a leak path occurs and hydrogen gas enters the reference pressure chamber to decrease the degree of vacuum of the reference pressure chamber, it becomes impossible to measure pressure with high accuracy, resulting in a decrease in reliability of measurement.

SUMMARY OF THE INVENTION

A semiconductor pressure sensor according to the present invention includes: a first semiconductor substrate having a recess formed thereon; a second semiconductor substrate joined to the first semiconductor substrate with an oxide film interposed therebetween; a reference pressure chamber formed as a space surrounded by the recess of the first semiconductor substrate and the second semiconductor substrate; a piezoresistor formed on a surface of the second semiconductor substrate that receives pressure, along an outer periphery of the reference pressure chamber; and a protective film formed on the surface of the second semiconductor substrate that receives pressure, and side surfaces of the second semiconductor substrate and the oxide film.

With the semiconductor pressure sensor according to the present invention, it is possible to maintain high reliability and measure pressure with high accuracy without increasing the size of the semiconductor pressure sensor.

BRIEF DESCRIPTION OF THE DRAWINGS

FIG. 6 is a plan view of a semiconductor pressure sensor according to Embodiment 2 of the present invention;

DETAILED DESCRIPTION OF THE PREFERRED EMBODIMENTS OF THE INVENTION

Embodiment 1

Figure 1:
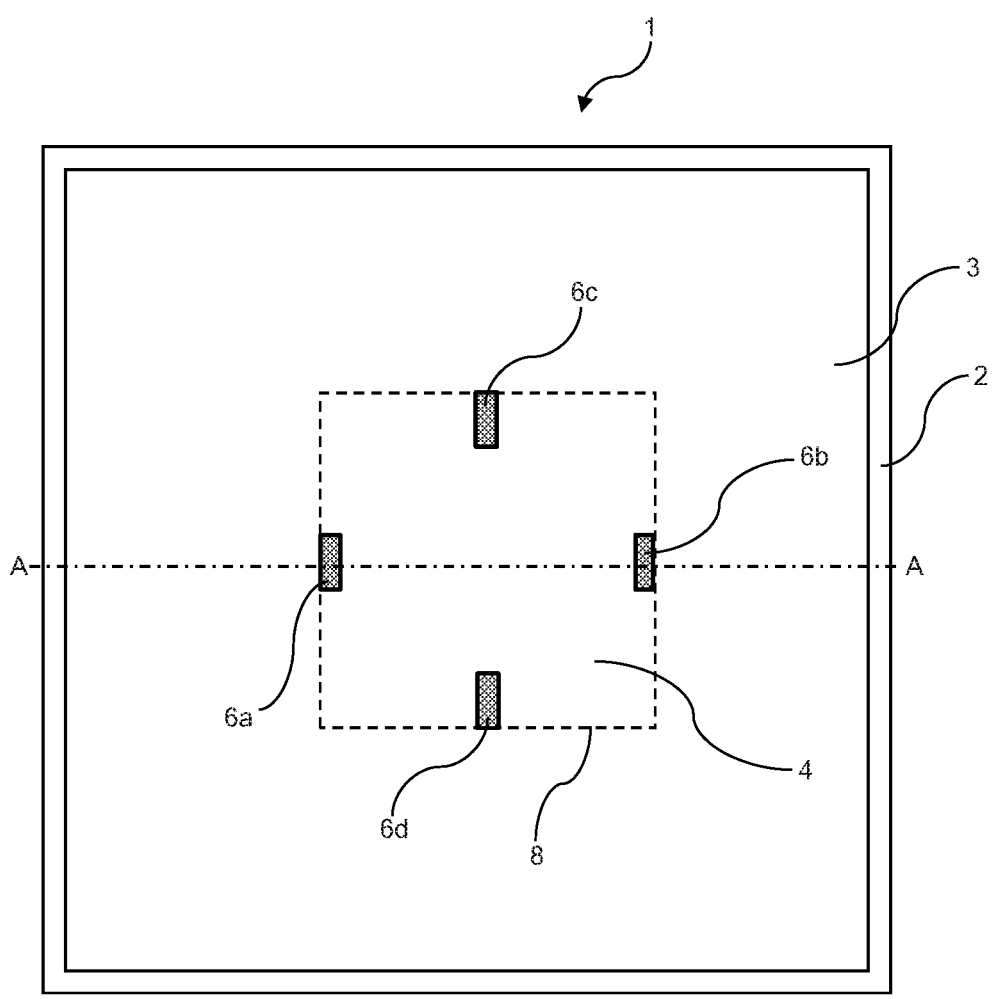
FIG. 1 is a plan view of a semiconductor pressure sensor according to Embodiment 1 of the present invention.
Figure 2:
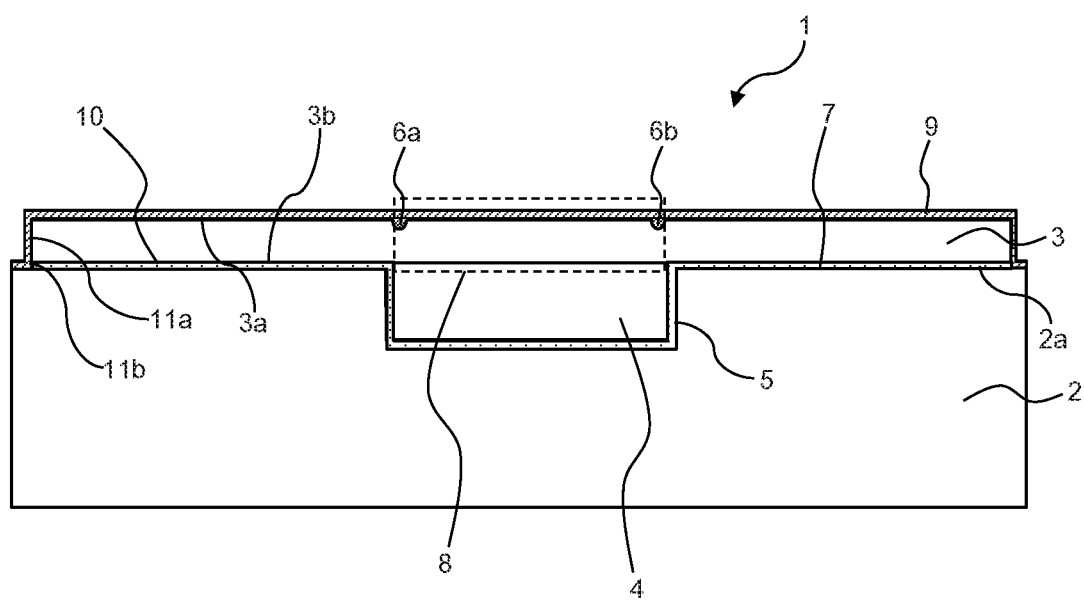
FIG. 2 is a cross-sectional view of the semiconductor pressure sensor according to Embodiment 1 of the present invention.

FIG. 1 is a plan view of a semiconductor pressure sensor 1 according to Embodiment 1 of the present invention, and FIG. 2 is a cross-sectional view taken along an alternate long and short dash line A-A in FIG. 1. Hereinafter, the semiconductor pressure sensor 1 will be described with reference to the drawings.

The semiconductor pressure sensor 1 includes: a first semiconductor substrate 2 that, has a recess 5 formed on a main surface 2a thereof; a second semiconductor substrate that covers the recess 5; and piezoresistors 6a to 6d that are formed on a main surface 3a of the second semiconductor substrate 3, which is a surface that receives pressure, so as to be spaced apart from each other. The main surface 2a of the first semiconductor substrate 2 and a main surface 3b of the second semiconductor substrate 3 are joined together with an oxide film 7 interposed therebetween. A protective film 9 is provided at a predetermined position described later such as the main surface 3a of the second semiconductor substrate 3 (in FIG. 1, the protective film 9 is not shown). Single crystal silicon substrates are used as the first semiconductor substrate 2 and the second semiconductor substrate 3, and the second semiconductor substrate 3 is a deformable thin substrate.

A reference pressure chamber 4 is formed as a space surrounded by: the recess 5, which is formed in the thickness direction from the main surface 2a of the first semiconductor substrate 2; and the second semiconductor substrate 3, which covers the recess 5. In FIG. 2, a region of the second semiconductor substrate 3, which opposes the recess 5, the region being surrounded by a broken line, forms a cross-section of a diaphragm 8. The diaphragm is a deformable pressure-receiving portion having a rectangular shape, and bending occurs therein in response to the received pressure. The degree of bending, that is, pressure-senstive characteristics, is determined by the size and the thickness of the diaphragm. Regarding the diaphragm 8, the thickness of the second semiconductor substrate 3 is mainly the thickness of the diaphragm. In FIG. 1, the portion surrounded by a broken line is a region where the diaphragm 8 is formed, and this portion has a square shape. The position of the broken line is the position of the outer periphery of the reference pressure chamber 4.

When pressure is applied to the main surface 3a of the second semiconductor substrate 3, the diaphragm 8 bends in response to the pressure difference between the reference pressure chamber 4 and the outside. Accordingly, bending also occurs in the regions of the piezoresistors Ga to Gd, and the resistance values thereof change in response to the bending. The resistance values are taken out as electric signals through a diffusion wiring layer or a metallic electrode film (not shown) to the outside.

The protective film 9 is formed so as to be laminated on the main surface 3a of the second semiconductor substrate 3 for the purpose of protecting the piezoresistors Ga to Gd, the diffusion wiring layer, etc. from an outside harmful environment. The protective film 9 is further formed so as to be laminated on a side surface portion 11a of the second semiconductor substrate 3 and a side surface portion 11b of the oxide film 7 such that the oxide film 7 and a joint interface 10 at which the first semiconductor substrate 2 and the second semiconductor substrate 3 are joined together are not exposed on the side surface of the semiconductor pressure sensor 1.

Figure 3:
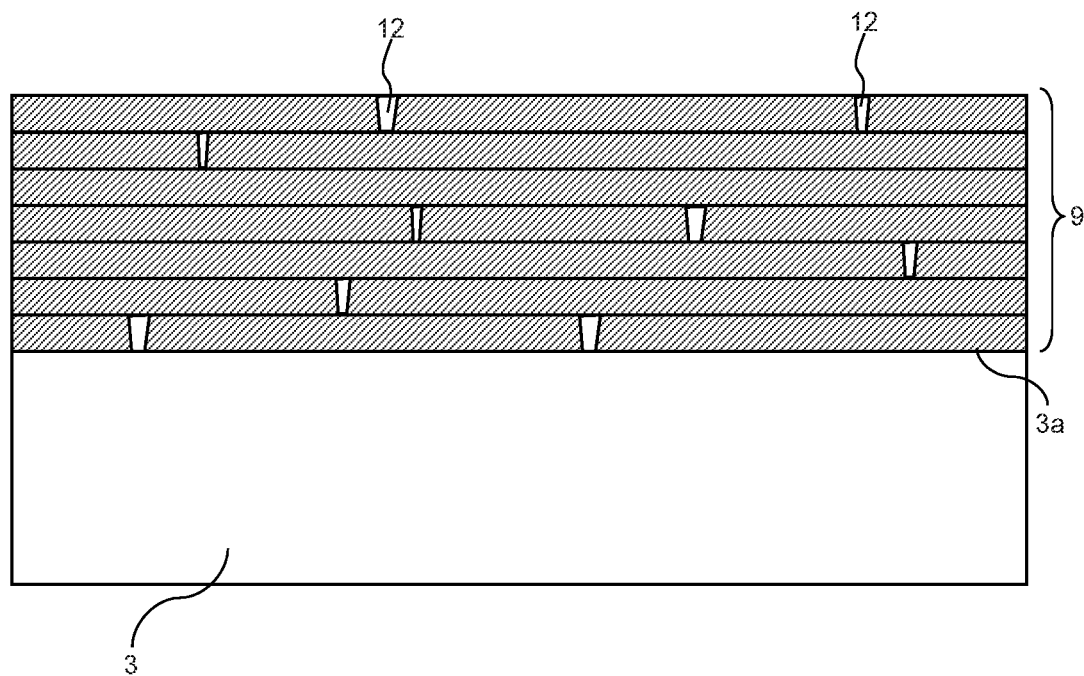
FIG. 3 is an enlarged view of the vicinity of a protective film in FIG. 2.

As the protective film. 9, for example, a silicon nitride film (SiNx) formed by a film formation method such as CVD is suitable. To reduce influence of residual stress of the silicon nitride film on the pressure-sensitive characteristics, the thickness of the protective film. 9 is preferably thinner as long as the protection effect is not impaired. However, when the protective film 9 is too thin, pinholes 12, which are difficult to eliminate, are likely to penetrate the protective film 9. When the pinholes 12 penetrate the protective film 9, the protection effect is significantly impaired. Therefore, as shown in FIG. 3, the protective film 9 is formed as a multilayer film obtained by laminating silicon nitride films. The lamination step is continuously carried out such that the thickness of a film to be formed per time is set to about 0.1 µm and a wafer is not taken out from a chamber for CVD each time a film is formed. The protective film 9 having no pinholes 12 penetrating the protective film 9 and having high reliability can be obtained by laminating films such that the pinholes 12 are not connected to each other. The pinholes 12 occur during film formation with a certain probability, but the pinholes 12 do not penetrate the entire protective film 9 unless the pinholes 12 occur and overlap with each other at the same position to be connected to each other each time lamination is performed. That is, the probability with which the pinholes 12 penetrating the protective film 9 are formed is proportional to the product of probabilities with which the pinholes 12 occur in the respective laminated films, and thus the probability of occurrence of the pinholes 12 penetrating the protective film 9 can be significantly reduced by increasing the number of laminated films. In reality, the number of laminated films in the protective film 9 may be selected as appropriate from between about 5 to 10 in consideration of the entire thickness and the residual stress of the protective film 9.

An index x representing the composition ratio between silicon atoms and nitrogen atoms in the silicon nitride film (SiNx) which does not contain hydrogen and oxygen can theoretically take a value in the range of 0 to 4/3. The case where x takes the maximum value 4/3 in the range corresponds to a case of having a stoichiometric composition ratio, and the composition ratio is represented by $Si_3N_4$. In the case with this composition ratio, all bonds are Si—N bonds, and $Si_3N_4$ has an atomic arrangement in which silicon atoms and nitrogen atoms are close-packed. Silicon atoms and nitrogen atoms have different atomic sizes. Thus, in the case with $Si_3N_4$ in which silicon atoms and nitrogen atoms are close-packed, voids through which hydrogen atoms and the like as well as molecules pass are not present, so that the effect of preventing gas permeation becomes highest.

On the other hand, bonds (Si—Si) between silicon atoms increase as the value of x decreases from 4/3. When silicon atoms having the same size are bonded to each other, the atomic arrangement structure does not become a close-packed structure, and voids having a size larger than the hydrogen atomic size occur. According to percolation theory, as the value of a decreases, the sizes of the voids increase, and the voids communicate with each other to form a leak path through which hydrogen atoms pass. That is, the permeation prevention performance decreases, so that hydrogen gas starts passing through the film, depending on the film thickness. In particular, when the value of x becomes equal to or less than ½, a network of the leak path is three-dimensionally formed, so that the permeation prevention performance is fully eliminated. In views of the characteristics of the silicon nitride film as described above, in order to obtain effective permeation prevention performance, the value of x is preferably not less than 1. Therefore, effective permeation prevention performance can be obtained when $1 \leq x \leq 4/3$ is satisfied.

Figure 4A:
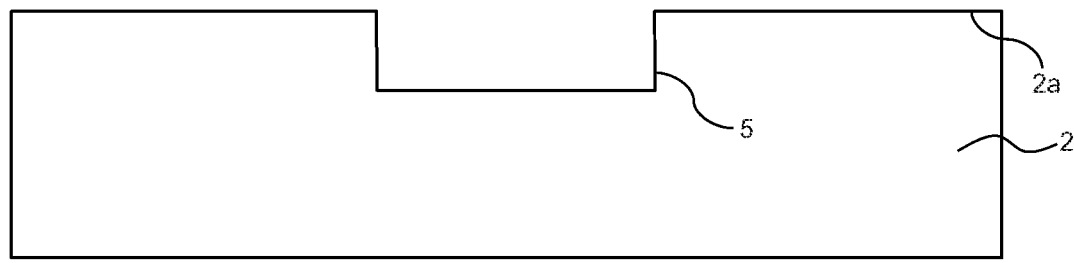
FIGS. 4A to 4C are diagrams showing a manufacturing process for the semiconductor pressure sensor according to Embodiment 1 of the present invention.

Next, a method for manufacturing the semiconductor pressure sensor 1 will be described with reference to FIGS. 4A to 5C. A plurality of semiconductor pressure sensors 1 are simultaneously manufactured on a wafer that is a single crystal silicon substrate. However, here, manufacture of one semiconductor pressure sensor 1 will be described. The semiconductor pressure sensor 1 has a square shape having one side of about 1 mm in a plan view. The diaphragm 8 has a square shape having one side of about 400 µm. First, as shown in FIG. 4A, the recess 5 is formed on the main surface 2a of the first semiconductor substrate 2 by etching. For forming the shape of the reference pressure chamber 4, that is, the shape of the diaphragm 8 with high accuracy, inductive coupled plasma-reactive ion etching (ICP-RIE) using the Bosch process is preferably used. The etching method is not limited thereto, and wet anisotropic etching using an etching solution such as potassium hydroxide (KOH) or tetramethylammonium hydroxide (TMAH) may be used for forming the recess 5. The depth of the recess 5 is related to the volume of the reference pressure chamber 1. From the viewpoint that a change in the internal pressure is reduced to be small even if any gas such as hydrogen enters the reference pressure chamber 4 by any chance, the volume is preferably larger, so that it is necessary to perform etching as deep as possible. However, when the depth of etching increases, the processing load increases. Here, entry of gas such as hydrogen into the reference pressure chamber 4 is prevented by not using a glass wafer as a seating, by forming the reference pressure chamber 4 with use of a single crystal silicon substrate, and by forming the protective film 9 laminated for blocking leak paths. Thus, from the viewpoint of reducing the processing load, the depth of the recess 5 may be about 10 µm to 100 µm.

Figure 4B:
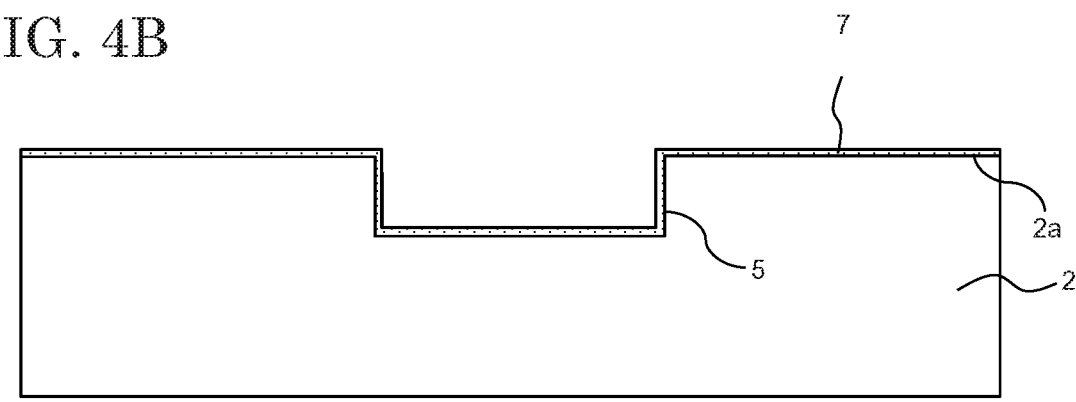

Subsequently, as shown in FIG. 4B, the oxide film 7 is formed on the main surface 2a of the first semiconductor substrate 2 by thermal oxidation. The oxide film 7 is also formed on the surface of the recess 5. The oxide film 7 is needed for promoting joining with the second semiconductor substrate 3, and the thickness thereof is suitably about 0.1 µm to 0.5 µm. Here, the example in which the oxide film 7 is formed on the main surface 2a of the first semiconductor substrate 2 has been described, but the oxide film 7 may be formed on the main surface 3b of the second semiconductor substrate 3.

Figure 4C:
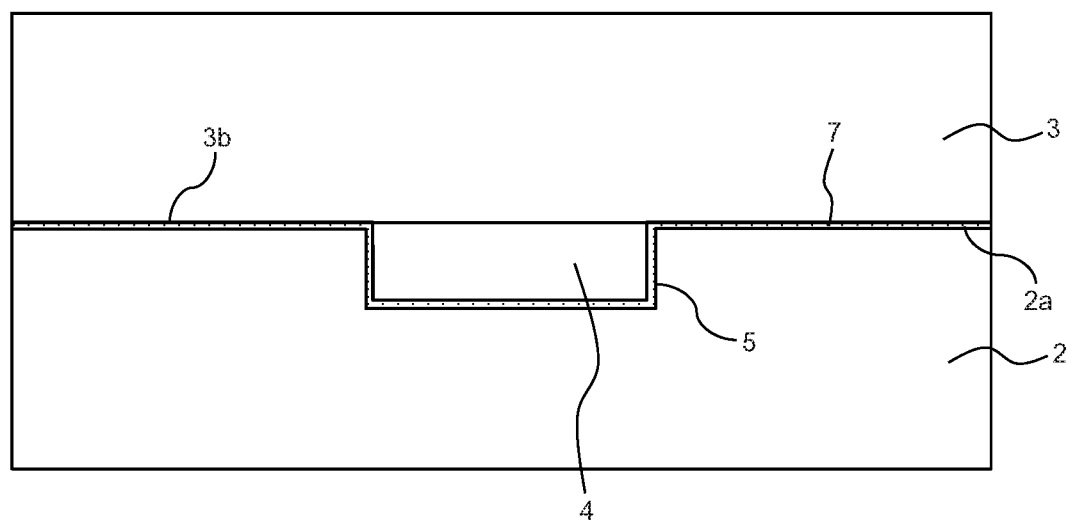

Subsequently, as shown in FIG. 4C, the main surface 2a of the first semiconductor substrate 2 and the main surface 3b of the second semiconductor substrate 3 are joined together in a vacuum with the oxide film 7 interposed therebetween, whereby the reference pressure chamber 4 is formed. The joining is preferably performed in an acid atmosphere at a high temperature of about 1100° C., but, depending on the proportion of the area of the recess 5 in the area of the entire wafer, the joining strength may be further enhanced by increasing the temperature to about 1200° C.

Figure 5A:
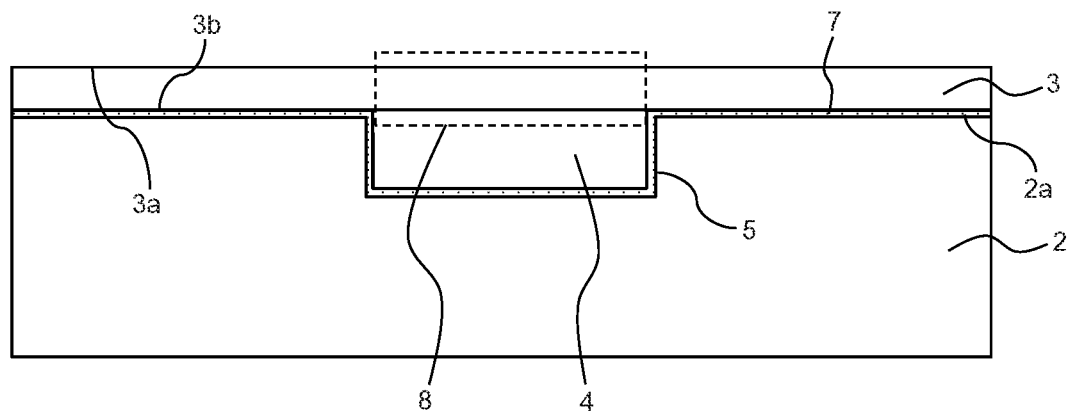
FIGS. 5A to 5C are diagrams showing the manufacturing process subsequent to FIGS. 4A to 4C.

Since a region that is a part of the second semiconductor substrate 3 and that covers the recess 5 becomes the diaphragm 8, the substrate thickness is adjusted in accordance with the range of pressure to be measured, after the first semiconductor substrate 2 and the second semiconductor substrate 3 are joined together. Specifically, the substrate thickness is adjusted to a predetermined thickness, for example, about 20 µm, as shown in FIG. 5A by grinding or polishing the entirety of the main surface 3a of the second semiconductor substrate 3. This is because, in joining, it is difficult to handle the second semiconductor substrate 3 having a small thickness of about 20 µm. Through the above steps, the diaphragm 8 having a predetermined thickness is formed.

Figure 5B:
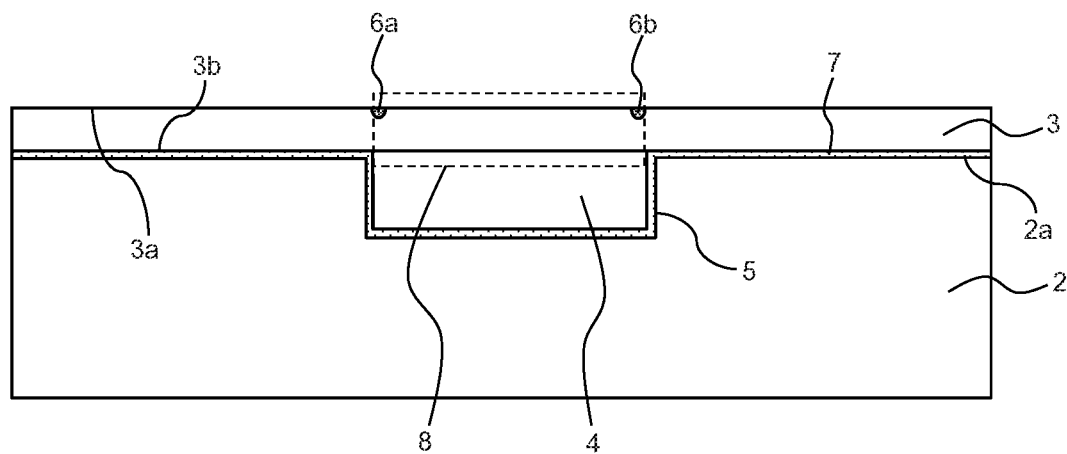

Subsequently, as shown in FIG. 5B, ion implantation of impurities such as boron is performed along the outer edge portion of the diaphragm 8, that is, along the outer periphery of the reference pressure chamber 4, and then thermal treatment or the like is performed, whereby the piezoresistors 6a to 6d are formed. Furthermore, a diffusion wiring layer (not shown) is formed by ion implantation and subsequent thermal treatment, and a metallic electrode film (not shown) is formed by forming a film of Al, Al—Si, Al—Si—Cu, or the like by a method such as sputtering.

Figure 5C:
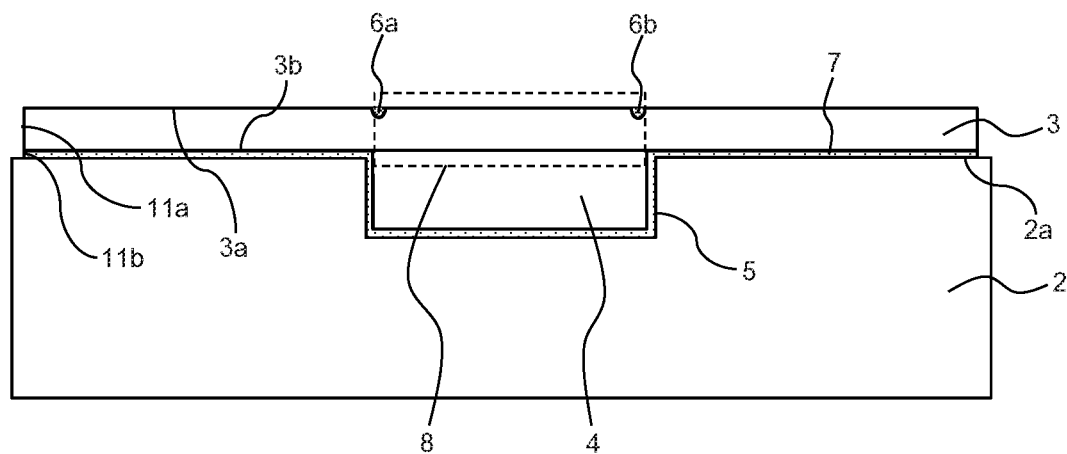

Subsequently, etching for penetrating the second semiconductor substrate and reaching the main surface 2 of the first semiconductor substrate 2 is performed in a boundary region of each semiconductor pressure sensor in a plan view within a single wafer, by means of ICP-RIE or the like. As a result of the etching, as shown in FIG. 5C, the side surface portion 11a of the second semiconductor substrate 3 and the side surface portion 11b of the oxide film 7 are exposed.

Subsequently, the protective film 9 is formed, so as to cover the main surface 3a of the second semiconductor substrate 3, the side surface portion 11a of the second semiconductor substrate 3, and the side surface portion 11b of the oxide film 7, as a multilayer film by forming a silicon nitride film a plurality of times by a film formation method such as CVD (Chemical Vapor Deposition). The multilayer film is formed by continuously performing film formation without taking out the wafer from a chamber for CVD each time a film is formed. Due to the formation of the laminated protective film 9, even when leak paths that extend through the joint interface 10 occur, the leak paths can be blocked, so that composition variation does not occur at the side surface portion 11b of the oxide film 7, and no pinholes 12 penetrate the entirety of the protective film 9. As a result of the formation of the protective film 9, the semiconductor pressure sensor 1 shown in FIG. 2 is obtained. A plurality of semiconductor pressure sensors 1 are manufactured on a wafer, and thus are subsequently separated from each other by dicing.

The silicon nitride film which does not contain hydrogen or oxygen can be formed by a versatile film formation method such as CVD in a semiconductor process. Thus, such a film formation method has high compatibility with a step such as ion implantation to be used for forming piezoresistors, and cost reduction can be achieved. In addition, the protective film 9 is formed on the side surface portion 11a of the second semiconductor substrate 3 and the side surface portion 11b of the oxide film 7, which are exposed in a boundary region of each semiconductor pressure sensor, and thus does not increase the size of the semiconductor pressure sensor 1. Moreover, a conventional design can be used without changing the design of the in-plane configuration of the diaphragm 8, the diffusion wiring layer, etc., and thus the cost for the materials and the manufacture does not increase. Furthermore, since a part of the boundary region is cut in the thickness direction of the wafer by etching, a dicing line is clarified when separating semiconductor pressure sensors from each other, so that occurrence of defectives due to errors in dicing position can be inhibited. In addition, the effect of shortening the time of the dicing step is also provided.

The use of the semiconductor pressure sensor 1 according to the present invention is not limited to a vehicle equipped with a fuel cell system. Also, for a conventional automobile equipped with an engine, an attempt for improving combustion efficiency has been made by a method such as mixing a small amount of hydrogen gas into intake air by using a technique such as fuel reforming. Thus, the semiconductor pressure sensor 1 according to the present invention is suitable for use for measuring the pressure of such air containing hydrogen gas.

As described above, in the semiconductor pressure sensor 1 according to Embodiment 1 of the present invention, since the side surface portions of the second semiconductor substrate and the oxide film are covered with the protective film, leak paths that extend through the joint interface generated during manufacture can be blocked at low cost without increasing the size of the semiconductor pressure sensor. In addition, since the protective film is provided, the side surface portion of the oxide film provided at the joint interface is not exposed, composition variation can be prevented in advance, so that high reliability can be maintained. Moreover, since the protective film is a multilayer film obtained by laminating silicon nitride films (SiNx) that satisfy $1 \leq x \leq 4/3$ and that do not contain hydrogen and oxygen, effective hydrogen permeation prevention performance can be obtained.

Embodiment 2

Figure 7:
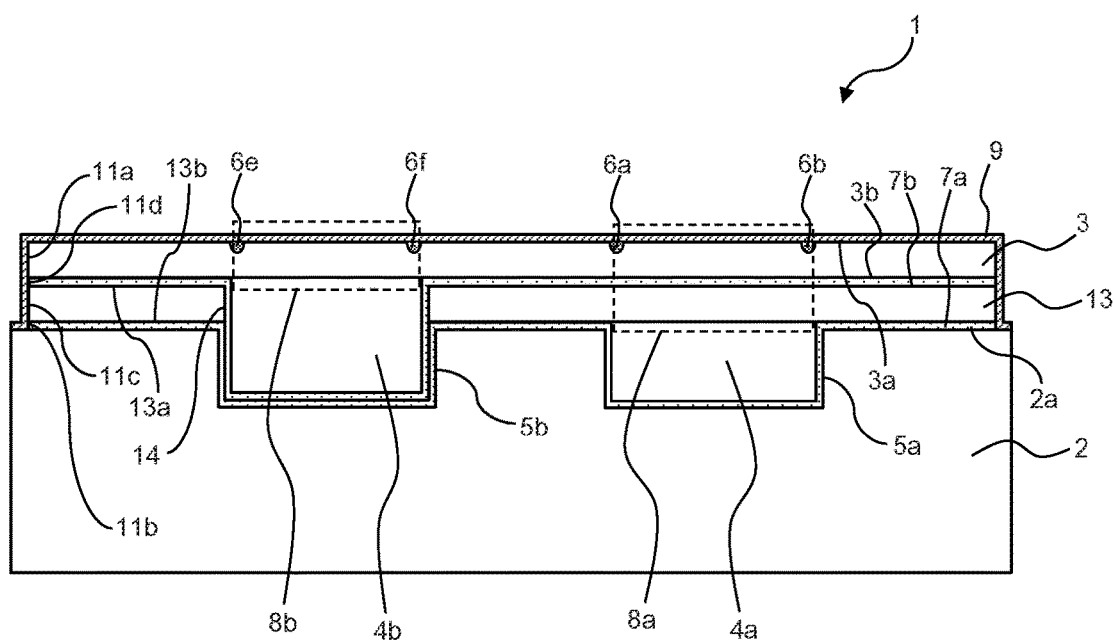
FIG. 7 is a cross-sectional view of the semiconductor pressure sensor according to Embodiment 2 of the present invention.

FIG. 6 shows a plan view of a semiconductor pressure sensor 1 according to Embodiment 2 of the present invention, and FIG. 7 shows a cross-sectional view of the semiconductor pressure sensor 1. FIG. 7 is a cross-sectional view taken along an alternate long and short dash line A-A in FIG. 6. In FIG. 6, a protective film 9 is not shown. In Embodiment 1, the semiconductor pressure sensor 1 includes the one reference pressure chamber 4. However, the semiconductor pressure sensor 1 according to Embodiment 2 includes two reference pressure chambers including diaphragms having different thicknesses. The other components are the same as described in Embodiment 1 and thus are designated by the same reference characters, and the description thereof is omitted.

The semiconductor pressure sensor 1 includes: a first semiconductor substrate 2 that has a first recess 5a and a second recess 5b formed on a main surface 2a thereof; an intermediate semiconductor substrate 13 that has a through hole 14 communicating with the second recess 5b and that covers the first recess 5a; a second semiconductor substrate 3 that covers the through hole 14 and the second recess 5b; and piezoresistors 6a to 6h that are provided on a main surface 3a of the second semiconductor substrate 3, which is a surface that receives pressure, so as to be spaced apart from each other. The main surface 2a of the first semiconductor substrate 2 and a main surface 13b of the intermediate semiconductor substrate 13 are joined together with a first oxide film 7a interposed therebetween, and a main surface 13a of the intermediate semiconductor substrate 13 and a main surface 3b of the second semiconductor substrate 3 are joined together with a second oxide film 7b interposed therebetween. The protective film 9 is provided on the main surface 3a of the second semiconductor substrate 3. A single crystal silicon substrate is used as the intermediate semiconductor substrate 13. Similar to the second semiconductor substrate 3, the intermediate semiconductor substrate 13 is a deformable thin substrate.

A first reference pressure chamber 4a is formed as a space surrounded by: the first recess 5a, which is formed in the thickness direction from the main surface 2a of the first semiconductor substrate 2; and the intermediate semiconductor substrate 13, which covers the first recess 5a. In FIG. 7, a region of the second semiconductor substrate 3 and the intermediate semiconductor substrate 13, which opposes the first recess 5a, the region being surrounded by a broken line at the right side, forms a cross-section of a first diaphragm 8a. Regarding the first diaphragm 8a, a thickness obtained by summing the thickness of the intermediate semiconductor substrate 13 and the thickness of the second semiconductor substrate 3 is mainly the thickness of the diaphragm. In FIG. 6, the portion surrounded by a broken line at the right side is a region where the first diaphragm 8a is formed, and has a square shape. The position of the broken line is the position of the outer periphery of the first reference pressure chamber 4a.

A second reference pressure chamber 4b is formed as a space surrounded by: the second recess 5b, which is formed in the thickness direction from the main surface 2a of the first semiconductor substrate 2; the intermediate semiconductor substrate 13, which forms the through hole 14; and the second semiconductor substrate 3, which covers the through hole 14. The through hole 14 is formed in the thickness direction of the intermediate semiconductor substrate 13 so as to correspond to the outer shape of the second recess 5b and communicate with the second recess 5b. In FIG. 7, a region of the second semiconductor substrate 3, which opposes the second recess 5b and the through hole 14, the region being surrounded by a broken line at the left side, forms a cross-section of a second diaphragm 8b. Regarding the second diaphragm 8b, the thickness of the second semiconductor substrate 3 is mainly the thickness of the diaphragm. In FIG. 6, the portion surrounded by a broken line at the left side is a region where the second diaphragm 8b is formed. The position of the broken line is the position of the outer periphery of the second reference pressure chamber 4b.

The first diaphragm 8a and the second diaphragm 8b have the same shape in FIG. 6, but, since the thicknesses thereof are different from each other, amounts of bending thereof with respect to the same pressure are different from each other. Thus, the pressure-sensitive characteristics of the first diaphragm 8a and the second diaphragm 8b are different from each other. The first diaphragm 8a which is thicker bends to a small extent, and the second diaphragm 8b which is thinner bends to a large extent. Therefore, pressure measurement is enabled in different pressure regions without increasing the size of the semiconductor pressure sensor 1. Accordingly, pressure measurement can be performed with high accuracy for different pressure ranges. Since the thickness of the second diaphragm 8b is smaller than that of the first diaphragm 8a, the second diaphragm 8b has a higher possibility of breakage. However, even when an abnormality such as breakage occurs in the second diaphragm 8b, pressure measurement in a wide range of pressure regions is possible with the first diaphragm 8a.

Next, a method for manufacturing the semiconductor pressure sensor 1 will be described. The semiconductor pressure sensor 1 has a square shape having one side of about 1 mm in a plan view. The first diaphragm. 8a and the second diaphragm 8b have a square shape having one side of about 300 μm. First, the first recess 5a and the second recess 5b are formed on the main surface 2a of the first semiconductor substrate 2 by etching.

Subsequently, the first oxide film 7a is formed on the main surface 2a of the first semiconductor substrate 2 by thermal oxidation. The first oxide film 7a is also formed on the surfaces of the first recess 5a and the second recess 5b. Here, the example in which the first oxide film 7a is formed on the main surface 2a of the first semiconductor substrate 2 has been described, but the first oxide film 7a may be formed on the main surface 13b of the intermediate semiconductor substrate 13.

Subsequently, the main surface 2a of the first semiconductor substrate 2 and the main surface 13b of the intermediate semiconductor substrate 13 are joined together in a vacuum, whereby the first reference pressure chamber 4a is formed. The joining is preferably performed is an acid atmosphere at a high temperature of about 1100° C.

Since the intermediate semiconductor substrate 13 that covers the first recess 5a becomes a portion of the first diaphragm 8a, the substrate thickness is adjusted in accordance with the range of pressure to be measured, after the first semiconductor substrate 2 and the intermediate semiconductor substrate 13 are joined together. Specifically, the substrate thickness is adjusted to a predetermined thickness, for example, about 20 μm, by grinding or polishing the entirety of the main surface 13a of the intermediate semiconductor substrate 13.

Subsequently, the through hole 14, which penetrates the intermediate semiconductor substrate 13 and communicates with the second recess 5b, is formed. As the means for forming the through hole 14, ICP-RIE using the Bosch process is preferable similar to the method for forming the first recess 5a and the second recess 5b. The outer shape of the through hole 14 is a square shape similar to the outer shape of the second recess 5b.

Subsequently, the second oxide film 7b is formed on the main surface 13a of the intermediate semiconductor substrate 13 by thermal oxidation. The second oxide film 7b is also formed on the wall surface of the through hole 14 and the surface of the second recess 5b. Here, the example in which the second oxide film 7b is formed on the main surface 13a of the intermediate semiconductor substrate 13 has been described, but the second oxide film 7b may be formed on the main surface 3b of the second semiconductor substrate 3.

Subsequently, the main surface 13a of the intermediate semiconductor substrate 13 and the main surface 3b of the second semiconductor substrate 3 are joined together in a vacuum, whereby the second reference pressure chamber 4b is formed. The joining is preferably performed in an acid atmosphere at a high temperature of about 1100° C.

Since the second semiconductor substrate 3 that covers the first recess 5a becomes a portion of the first diaphragm 8a, and the second semiconductor substrate 3 that covers the second recess 5b becomes the second diaphragm 8b, the substrate thickness is adjusted in accordance with the range of pressure to be measured, after the intermediate semiconductor substrate 13 and the second semiconductor substrate 3 are joined together. Specifically, the substrate thickness is adjusted to a predetermined thickness, for example, about 20 μm, by grinding or polishing the entirety of the main surface 3a of the second semiconductor substrate 3. Through the above steps, the first diaphragm 8a and the second diaphragm 5b having predetermined different thicknesses are formed.

Subsequently, ion implantation of impurities such as boron is performed along the outer edge portions of the first diaphragm 8a and the second diaphragm 8b, that is, along the outer peripheries of the first reference pressure chamber 4a and the second reference pressure chamber 4b, and then thermal treatment or the like is performed, whereby the piezoresistors 6a to 6h are formed. Furthermore, a diffusion wiring layer is formed by ion implantation and subsequent thermal treatment, and a metallic electrode film formed by forming a film of Al, Al—Si, Al—Si—Cu, or the like by a method such as sputtering.

Subsequently, etching for penetrating the second semiconductor substrate 3 and the intermediate semiconductor substrate 13 and reaching the main surface 2a of the first semiconductor substrate 2 is performed in a boundary region of the semiconductor pressure sensor in a plan view within a single wafer, by means of ICP-RIE or the like. As a result of the etching, side surface portions 11a to 11d of the second semiconductor substrate 3, the first oxide film 7a, the intermediate semiconductor substrate 13, and the second oxide film 7b are exposed. Thereafter, the protective film 9 is formed, so as to cover the main surface 3a of the second semiconductor substrate 3, and the side surface portions 11a to 11d of the second semiconductor substrate 3, the first oxide film 7a, the intermediate semiconductor substrate 13, and the second oxide film 7b, as a multilayer film by forming a silicon nitride film a plurality of times by a film formation method such as CVD, whereby the semiconductor pressure sensor 1 is obtained. A plurality of semiconductor pressure sensors 1 are manufactured on a wafer, and thus are subsequently separated from each other by dicing.

Figure 8:
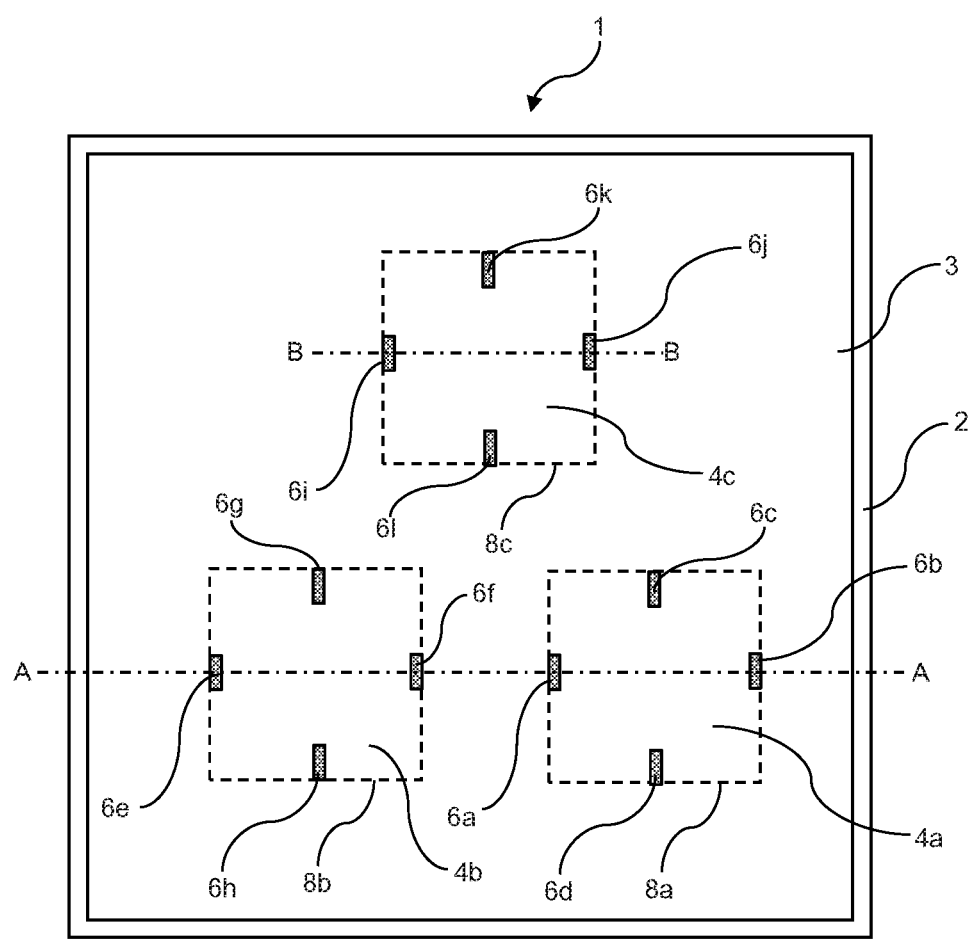
FIG. 8 is a plan view of another semiconductor pressure sensor according to Embodiment 2 of the present invention.
Figure 9:
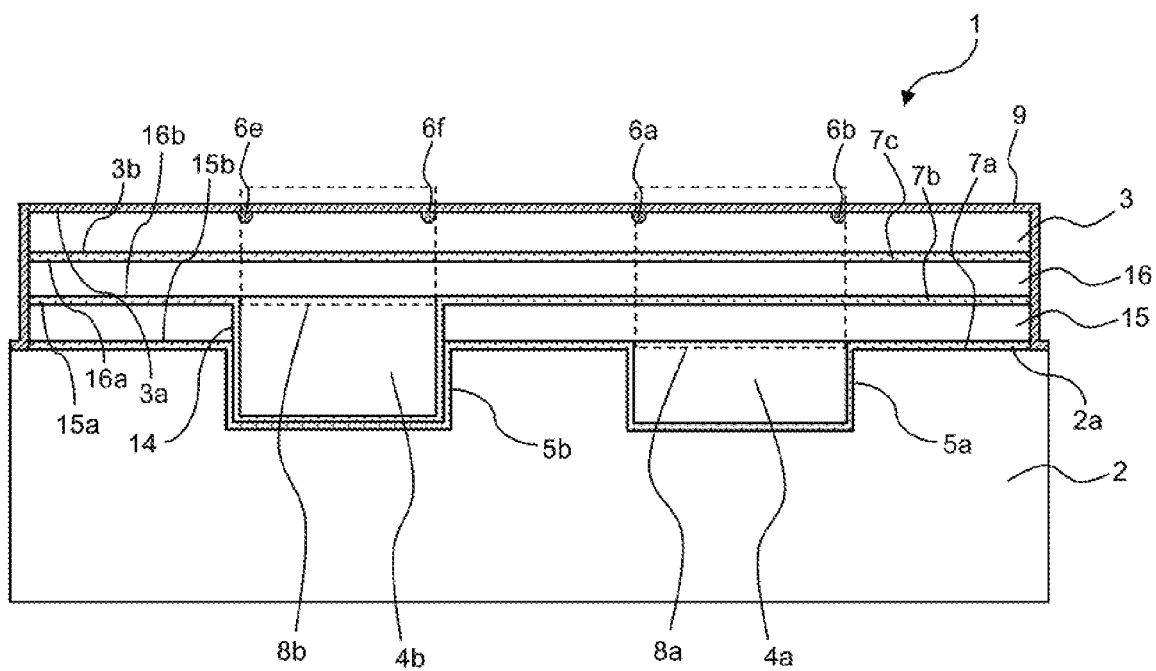
FIG. 9 is a cross-sectional view of the other semiconductor pressure sensor according to Embodiment 2 of the present invention.
Figure 10:
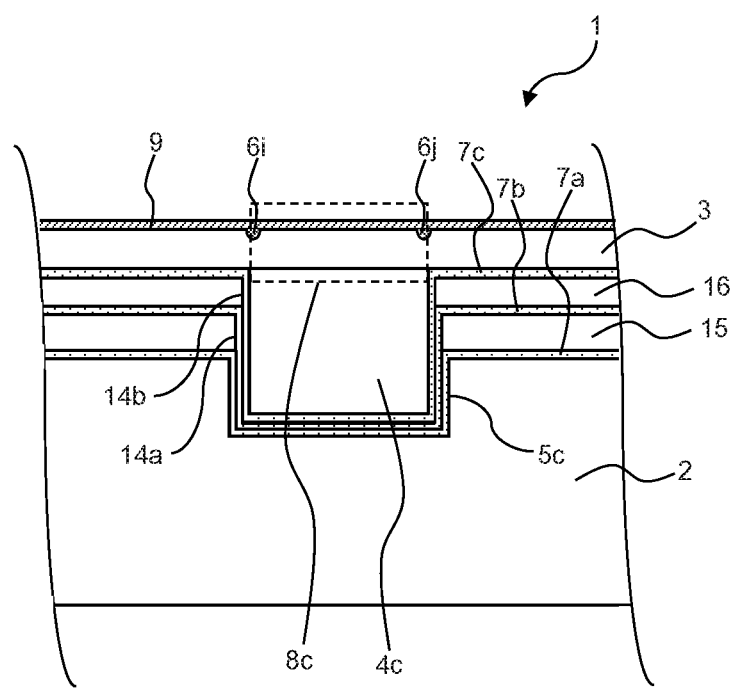
FIG. 10 is a cross-sectional view of the other semiconductor pressure sensor according to Embodiment 2 of the present invention.

Next, another semiconductor pressure sensor 1 according to Embodiment 2 will be described with reference to FIGS. 8 to 10. FIG. 8 is a plan view of the semiconductor pressure sensor 1, and FIGS. 9 and 10 are cross-sectional views of the semiconductor pressure sensor 1. FIG. 9 is a cross-sectional view taken along an alternate long and short dash line A-A in FIG. 8, and FIG. 10 is a cross-sectional view taken along an alternate long and short dash line B-B in FIG. 8. In FIG. 8, the protective film 9 is not shown. The semiconductor pressure sensor 1 is provided with a first intermediate semiconductor substrate 15 and a second intermediate semiconductor substrate 16 and additionally includes a third reference pressure chamber 4c and a third diaphragm 8c. The other components are the same as described above, and thus are designated by the same reference characters.

The third reference pressure chamber 4c is formed as a space surrounded by: a third recess 5c that is formed in the thickness direction from the main surface 2a of the first semiconductor substrate 2; the first intermediate semiconductor substrate 15 and the second intermediate semiconductor substrate 16 that form through holes 14a and 14b; and the second semiconductor substrate 3 that covers the through hole 14b. The through hole 14a is formed in the thickness direction of the first intermediate semiconductor substrate 15 so as to correspond to the outer shape of the third recess 5c and communicate with the third recess 5c. The through hole 14b is formed in the thickness direction of the second intermediate semiconductor substrate 16 so as to correspond to the outer shape of the third recess 5c and communicate with the third recess 5c and the through hole 14a. In FIG. 10, a region of the second semiconductor substrate 3, which opposes the third recess 5c and the through holes 14a and 14b, the region being surrounded by a broken line, forms a cross-section of the third diaphragm 8c. Regarding the third diaphragm 8c, the thickness of the second semiconductor substrate 3 is mainly the thickness of the diaphragm. In FIG. 8, a portion surrounded by a broken line at the upper side is a region where the third diaphragm 8c is formed. The position of the broken line is the position of the outer periphery of the third reference pressure chamber 4c. The first intermediate semiconductor substrate 15 and the second intermediate semiconductor substrate 16 are joined together with the second oxide film 7b interposed therebetween, and the second intermediate semiconductor substrate 16 and the second semiconductor substrate 3 are joined together with a third oxide film 7c interposed therebetween.

Since the semiconductor pressure sensor 1 shown in FIGS. 8 to 10 includes three diaphragms having different thicknesses, the first diaphragm 8a, the second diaphragm 8b, and the third diaphragm 8c, pressure measurement is enabled in further different pressure regions without increasing the size of the semiconductor pressure sensor 1.

As described above, in the semiconductor pressure sensor 1 according to Embodiment 2 of the present invention, since the two or three diaphragms have different pressure-sensitive characteristics by changing the thickness with the same shape in a plan view, high-accuracy measurement for different pressure regions can be achieved at low cost without increasing the size of the semiconductor pressure sensor. In addition, since the two or three diaphragms are provided, even when an abnormality such as breakage occurs in one or two diaphragms, measurement can be continued with another diaphragm, so that malfunction of the entire system can be avoided. Here, the example of the semiconductor pressure sensor including the two or three diaphragms has been described. However, when an intermediate semiconductor substrate having a through hole communicating with the recess of the first semiconductor substrate is further stacked, a semiconductor pressure sensor having four or more diaphragms with different thicknesses can be further produced.

The configurations described above in Embodiments 1 and 2 are examples of the configuration of the present invention, and it is needless to say that modifications, including combinations or partial deletions of embodiments, can be made without departing from the scope and spirit of the present invention.

DESCRIPTION OF THE REFERENCE CHARACTERS 1 semiconductor pressure sensor
2 first semiconductor substrate
3 second semiconductor substrate
4 reference pressure chamber
5 recess
6 piezoresistor
7 oxide film
8 diaphragm
9 protective film
10 joint interface
11 side surface portion
12 pinhole
13 intermediate semiconductor substrate
14 through hole
15 first intermediate semiconductor substrate
16 second intermediate semiconductor substrate

What is claimed is:
1. A semiconductor pressure sensor comprising:
a first semiconductor substrate having a recess formed thereon;
a second semiconductor substrate joined to the first semiconductor substrate with an oxide film interposed therebetween;
a reference pressure chamber formed as a space surrounded by the recess of the first semiconductor substrate and the second semiconductor substrate;
a piezoresistor formed on a surface of the second semiconductor substrate that receives pressure, along an outer periphery of the reference pressure chamber; and
a protective film formed on the surface of the second semiconductor substrate that receives pressure, and side surfaces of the second semiconductor substrate and the oxide film,
wherein the protective film is a multilayer film obtained by laminating silicon nitride films SiNx, and
wherein each laminated silicon nitride film SiNx has a thickness of 0.1 μm, and wherein the multilayer film comprises between five and ten of the laminated silicon nitride films SiNx.

2. A semiconductor pressure sensor comprising:
a first semiconductor substrate having a plurality of recesses formed thereon;
an intermediate semiconductor substrate joined to the first semiconductor substrate with a first oxide film interposed therebetween;
a second semiconductor substrate joined to the intermediate semiconductor substrate with a second oxide film interposed therebetween;
a first reference pressure chamber formed as a space surrounded by a first recess of the first semiconductor substrate and the intermediate semiconductor substrate;
a second reference pressure chamber formed as a space surrounded by a second recess formed on the first semiconductor substrate, the intermediate semiconductor substrate, and the second semiconductor substrate, the intermediate semiconductor substrate having a through hole communicating with the second recess of the first semiconductor substrate;
piezoresistors formed on a surface of the second semiconductor substrate that receives pressure, along outer peripheries of the first reference pressure chamber and the second reference pressure chamber; and
a protective film formed on the surface of the second semiconductor substrate that receives pressure, a side surface of the second semiconductor substrate, a side surface of the intermediate semiconductor substrate, a side surface of the first oxide film, and a side surface of the second oxide film.

3. The semiconductor pressure sensor according to claim 2, wherein the protective film is a multilayer film obtained by laminating silicon nitride films SiNx that satisfy $1 \leq x \leq 4/3$ and that do not contain hydrogen and oxygen.

4. The semiconductor pressure sensor according to claim 3, wherein the number of the silicon nitride films SiNx laminated in the multilayer film is 5 to 10.

5. The semiconductor pressure sensor according to claim 2, wherein the protective film is a multilayer film obtained by laminating silicon nitride films SiNx, and
wherein each laminated silicon nitride film SiNx has a thickness of 0.1 μm, and
wherein the multilayer film comprises between five and ten of the laminated silicon nitride films SiNx.

* * * * *